United States Patent [19]
Borghese et al.

[11] 4,417,292
[45] Nov. 22, 1983

[54] POWER AMPLIFIER PROTECTION CIRCUIT

[75] Inventors: Valerio Borghese, Sedriano; Pietro Erratico, Milan; Silvano Coccetti, Vittuone, all of Italy

[73] Assignee: SGS-ATES Componenti Elettronici SpA, Milan, Italy

[21] Appl. No.: 377,994

[22] Filed: May 13, 1982

[30] Foreign Application Priority Data

May 28, 1981 [IT] Italy ................. 21999 A/81

[51] Int. Cl.³ .......................... H02H 3/26; H03F 3/04
[52] U.S. Cl. .................................. 361/87; 330/207 P; 330/298; 361/88
[58] Field of Search ............................ 361/86, 87, 88; 330/207 P, 298

[56] References Cited

U.S. PATENT DOCUMENTS 3,845,405  10/1974  Leidich ............................. 330/298

OTHER PUBLICATIONS

A. Romano et al., A monolithic Integrated Circuit for Vertical Deflection in Television Receivers, Transactions CE, Feb. 1975, pp. 85–93.

Primary Examiner—Harry E. Moose, Jr.
Attorney, Agent, or Firm—Wenderoth, Lind & Ponack

[57] ABSTRACT

A protective current mirror, with a reflection ratio greater than one, is connected as the active load of an input differential amplifier of a power amplifier. This mirror is provided in addition to the usual current mirror which has its output connected to the drive transistor of the output power amplifier stage. The protective mirror senses the imbalance due to a voltage peak which occurs at an inverted input of the input differential amplifier at the very beginning of the descending portion of a sawtooth input signal ramp voltage and the protective mirror operates a protective transistor which is connected to the base of the power amplifier drive transistor so as to keep one power transistor of the final power amplifier stage in its inactive state. Protection of the output power transistor occurs before the output of the power amplifier has reached its maximum voltage level.

4 Claims, 5 Drawing Figures

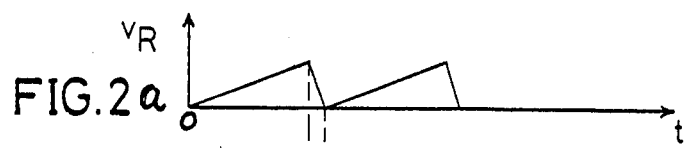
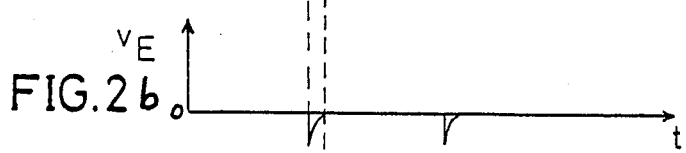
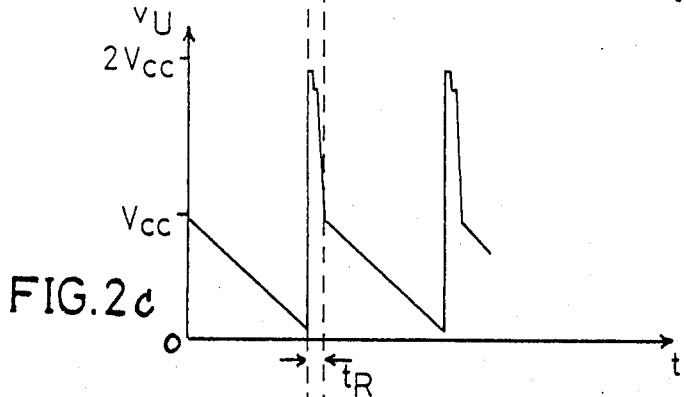
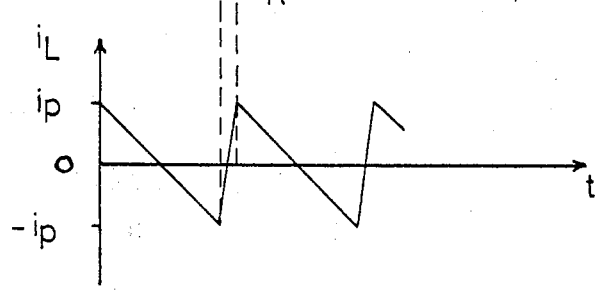

POWER AMPLIFIER PROTECTION CIRCUIT

BACKGROUND OF THE INVENTION

The present invention concerns circuits for the deflection of the electron beam in a television picture tube and, more specifically, a circuit arrangement for the protection of the final stage of a monolithic integrated circuit power amplifier designed to power the vertical deflection control of the picture tube.

A vertical deflection circuit for a television picture tube usually includes an oscillator, a sawtooth signal generator, a yoke driver amplifier and a flyback signal generator. Such circuits can be built on a single silicon chip by applying the common manufacturing techniques used for monolithic integrated circuits. A vertical deflection circuit of this type is described in detail, for example, in the article entitled: "A MONOLITHIC INTEGRATED CIRCUIT FOR VERTICAL DEFLECTION IN TELEVISION RECEIVERS", submitted by A. Romano and L. Venutti to the 1973 Chicago Fall Conference and published in February 1975 in *Transactions on Consumer Electronics*, p. 85–93.

A limitation in the use of integrated circuits for vertical deflection power amplifiers is the relatively low power that can be supplied by the final stage and, particularly, by the relatively low power that the output transistor can handle, the output transistor having the load located between collector and emitter thereof. The output transistor is actually the circuit component subjected to the greatest stress in terms of voltage and power. Specifically, during the normal operation of the amplifier, its collector-emitter voltage periodically reaches twice the circuit power supply voltage. In order to prevent current from flowing through the transistor under such voltage conditions, which would mean subjecting the transistor to particularly severe stress, or having to resort to higher power transistors which require greater surface areas on the silicon chip, a usual prior art technique is to cause the transistor, under overvoltage conditions, to operate with the lowest possible impedance between its base and emitter, that is, under conditions approaching those involving the highest breakdown voltage, called by the experts $BV_{CES}$ (shorted-base collector-to-emitter breakdown voltage). For example, in the circuit described in the publication referred to above, a protective transistor is inserted between the base and the emitter of the final power output transistor which, through an appropriate connection to the amplifier output, is placed in saturation as soon as the output voltage level exceeds the circuit power supply voltage. In this manner, the final power output transistor, having a very low base-emitter impedance, is inactive and therefore is able to withstand the maximum power dissipation and voltage permitted by its physical and geometric features.

In some cases, however, even with the usual prior art protection techniques, the final power output transistor, before the intervention of the protective transistor, passes a current which, when combined with a relatively high collector-emitter voltage, causes it to operate at power levels which are very close to the safety limits. In any case, the final power output transistor is subjected to stressful conditions for long periods of time, which may cause a rapid deterioration of the transistor, thereby resulting in the failure of the entire integrated circuit. In order to reduce this effect, it is necessary for the protective transistor to become saturated before the amplifier output voltage reaches the power supply voltage level. A known system to obtain this result consists of obtaining a pulse from the oscillator which controls the sawtooth signal generator, the pulse having the same period as the sawtooth signal and starting at the end of the front, or ramp portion, of said signal. The obtained pulse is used to cause the saturation of the protective transistor. In this manner, since the amplifier output voltage reaches the power supply voltage level only after the end of the ramp, the final power output transistor is in a state having a minimum base-emitter impedance and having a collector-emitter voltage which is lower than the power supply voltage.

Obtaining a pulse from the oscillator to operate the protective transistor in the manner described above may be convenient when the oscillator is integrated in the same silicon chip that contains the power amplifier, but is no longer so when it is necessary to resort to a special terminal for connection to an outside oscillator. In any case, the protection thus obtained occurs at predetermined cyclic intervals, and therefore has no effect in the case of output overvoltages due to accidental interruptions in the ramp.

SUMMARY OF THE INVENTION

An object of the present invention is to obtain a circuit arrangement for the protection of the final stage of a monolithic integrated circuit power amplifier used for the vertical deflection system of a picture tube which will not require an external connection to the oscillator in the system and which will operate in case of any amplifier output overvoltage.

The present invention utilizes a protective current mirror with a reflection ratio greater than 1 connected as the active load of an input differential amplifier of the power amplifier to be protected. This mirror is provided in addition to the usual current mirror which has its output connected to the drive transistor of the output power amplifier stage. The protective mirror senses the imbalance due to a voltage peak which occurs at an inverted input of the input differential amplifier at the very beginning of the descending portion of a sawtooth wave input signal ramp voltage. The protective mirror operates a protective transistor which is connected to the base of the power amplifier drive transistor so as to keep one power transistor of the final power amplifier stage in its inactive state. Protection of the output power transistor occurs before the output of the power amplifier has a chance to reach its maximum voltage level.

BRIEF DESCRIPTION OF THE DRAWINGS

The invention will be better understood from the following detailed description of one of its embodiments, presented simply as an example and therefore not limiting its scope, with reference to the attached drawing figures, where:

FIG. 2 shows the waveforms corresponding to the voltages and currents at various points in the circuit shown in FIG. 1.

DESCRIPTION OF PREFERRED EMBODIMENT

Figure 1:
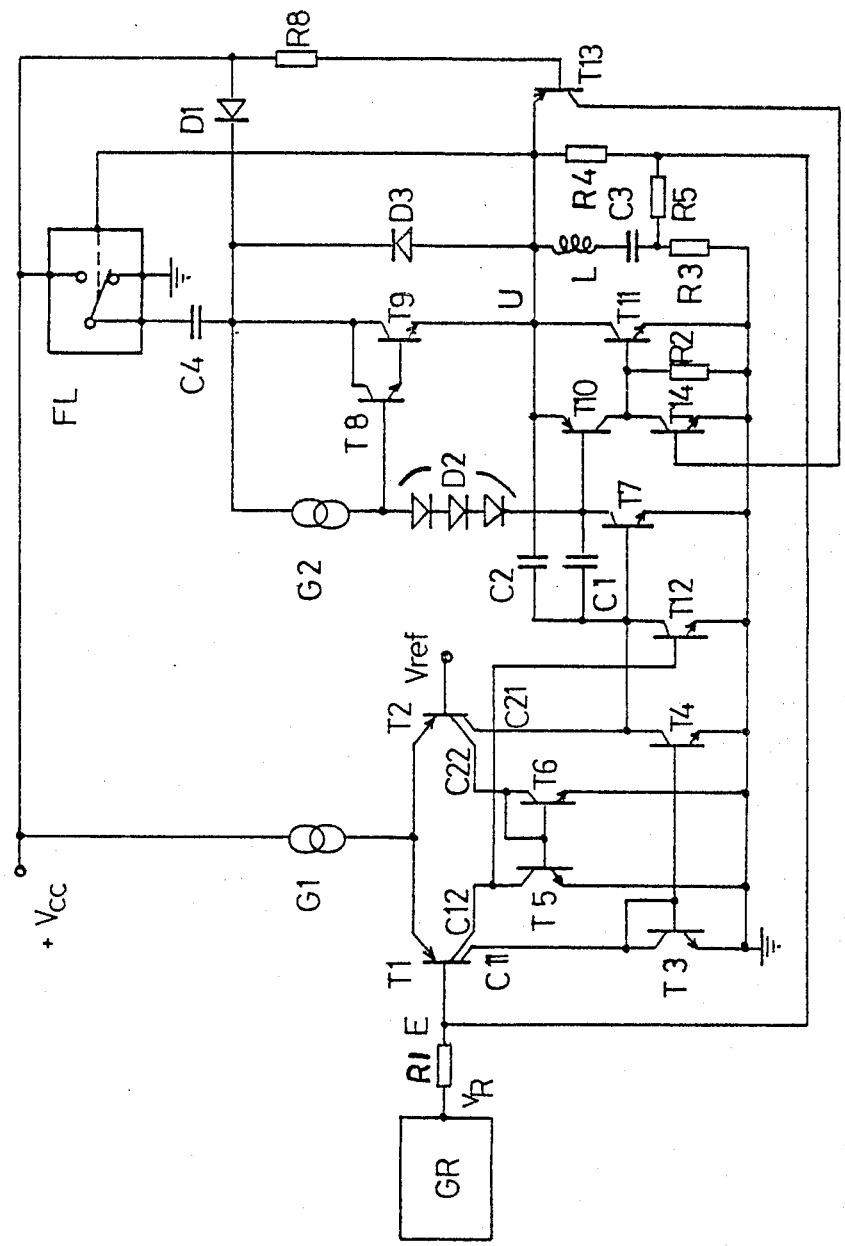
FIG. 1 shows the circuit diagram of a vertical deflection power amplifier incorporating the present invention.

The power amplifier in FIG. 1 has as its pre-amplifier stage a differential amplifier circuit comprising two PNP transistors T1 and T2, each having two collectors. The emitters of transistors T1 and T2 are both connected to one terminal of a constant current generator G1. The other terminal of generator G1 is connected to the positive terminal +Vcc of the power supply voltage source. The base of transistor T2 is connected to a reference voltage source Vref and the base of transistor T1, designated as point E, is used as the differential amplifier input. The amplifier input E is connected, through a resistor R1, to a sawtooth signal generator GR. One collector of transistor T1, designated as C11, is connected to an input branch of a first current mirror, having a reflection ratio or current gain equal to 1, and consisting of two identical NPN transistors T3 and T4. Transistor T3 is connected as a diode. Transistor T4, contained in the mirror output branch, has its collector connected to a collector, designated as C21, of transistor T2. The emitters of the two transistors T3 and T4 of the first mirror are both connected to the negative terminal of the power supply voltage source, represented in FIG. 1 by the ground symbol. The other two collectors C12 and C22 of transistors T1 and T2 of the differential amplifier are connected to a second current mirror, having a reflection ratio greater than 1, and consisting of two transistors T5 and T6, the latter transistor being diode connected, the two transistors having emitter junctions of different areas. Specifically, the emitter area of transistor T5 is larger, for example, by a factor of 5, than the emitter of transistor T6. The connection of the second mirror to differential transistors T1 and T2 is inverted relative to that of the first mirror, in that the input branch of the second power mirror, comprising transistor T6, is connected to transistor T2 and the output branch of the second mirror, comprising transistor T5, is connected to transistor T1.

The differential amplifier output from the collector of transistor T4 is input to the base of an NPN transistor T7, connected in a common emitter configuration and used as the final stage driver. The final stage has an "upper" section consisting of a pair of Darlington connected NPN transistors T8 and T9, which have their collectors connected through a forward biased diode D1 to the positive terminal +Vcc of the power supply voltage source. The final stage also has a "lower" section consisting of a PNP transistor T10 and an NPN transistor T11. The emitter of transistor T10 and the collector of transistor T11 are both connected to the emitter of transistor T9 at a point, indicated by the designation U in FIG. 1, which constitutes the power amplifier output. The collector of transistor T10 is connected to the base of transistor T11 and is connected through a resistor R2, to ground. The emitter of transistor T11 is also grounded. The bases of transistors T10 and T8 are connected to the collector of driver transistor T7, the former directly and the latter through three diodes, designated as D2 in FIG. 1. The diodes D2 are forward biased by means of a constant current generator G2 located between the base and collector of transistor T8. The purpose of the diodes D2 is to determine the final stage idle current.

The collector of transistor T5 is connected to the base of an NPN transistor T12 which has its collector connected to the base of driver transistor T7 and which has its emitter grounded. Capacitors C1 and C2 respectively connect the base of transistor T7 to the collector of transistor T7 and connect the base of transistor T7 to the output terminal U. The function of capacitors C1 and C2 is to frequency compensate the amplifier response.

The vertical deflection control circuit of a picture tube, represented by the series connection of an inductor L, a capacitor C3 and a resistor R3 is connected between the amplifier output U and ground. A reverse biased diode D3 is connected between the emitter and the collector of transistor T9.

The amplifier output U is connected to the input E through a feedback network used for the determination of both the DC and alternating current gain. The feedback network comprises a resistor R4 connected between terminals U and E and a resistor R5 connected between the junction of capacitor C3 and resistor R3 and the input terminal E.

Output terminal U is also connected to the emitter of a PNP transistor T13, which as its base connected to the power supply voltage terminal +Vcc through a resistor R8 and has its collector connected to the base of an NPN transistor T14. The collector of transistor T14 is connected to the base of transistor T11 and the emitter of transistor T14 is grounded.

A flyback signal generator, designated in FIG. 1 by a block FL, contains a switch operated by output U, and operates so as to connected, through a capacitor C4, the collector of transistor T9 to the power supply voltage terminal +Vcc or to ground depending on the amplifier output signal, as will be explained below in greater detail. FIG. 8 of the aforecited Romano et al. article illustrates one example of circuitry which may comprise the flyback signal generator FL and accordingly, a detailed description of the contents of generator FL has been omitted for simplicity.

The circuit shown in FIG. 1 and described above is known to television circuit experts, with the exception of the circuit elements added by this invention and including the second power mirror T5, T6 and transistor switch T12. Accordingly, only a summary explanation of the operation of FIG. 1 will be given below, with a reference for further details to other prior art publications, for example, the aforecited article by A. Romano and L. Venutti.

A sawtooth signal generated by signal generator GR and shown in FIG. 2a as a voltage $V_R$ which is variable as a function of time t, is applied to the circuit input E and voltage amplified first by the differential amplifier comprising transistors T1 and T2 and then by driver transistor T7. The amplified output signal voltage of transistor T7 is fed to two sections in the final stage which comprises a common current amplifier with "almost complementary" symmetry and which operates in the AB class. At this instant of time corresponding to the beginning of the front or ramp portion of the input signal, transistor T11 in the lower section of the final stage has only an idling current flowing therethrough, whereas transistor T9 in the upper section of the final stage supplies its maximum current, $i_p$, to the load inductor L. As the ramp rises, transistor T11 increases its conductivity, drawing current away from the load, whereas the current passing through transistor T9 decreases. At the time corresponding to the end of the ramp, transistor T11 carries its maximum current, $-i_p$, and transistor T9 is in its inactive state. The current $i_L$ which passes through the load is shown as a function of time t in FIG. 2d. The linear response of the amplifier is assured by selecting the appropriate gains of the stages and by appropriately selecting the feedback network components. At the time corresponding to the beginning of the descending front portion of the signal $V_R$, the drive transistor T7, as well as transistor T11, become inactive and the flyback signal generator FL, which, during the duration of the ramp, keeps one terminal of capacitor C4 grounded, is operated so as to connect said terminal of capacitor C4 directly to the power supply voltage terminal +Vcc. Therefore, the current $i_L$ which flows through inductor L is first inverted while passing through D3 and C4 and than rises to its maximum value $i_p$ as a result of the conductivity of transistor T9. This typically occurs over a time period of 0.8-1 msec, called the flyback period and indicated by $t_R$ in FIGS. 2a-2d. At the end of this time period, the amplifier returns to its linear operating condition and is ready to start a new cycle.

Let us consider now the operation of a circuit identical to that shown in FIG. 1, but without the circuit arrangement comprising the present invention, i.e.—without transistor T5, T6, and T12. As soon as the output voltage $v_U$, shown as a function of time t in FIG. 2c, exceeds the power supply voltage +Vcc by a value equal to the base-emitter voltage $V_{BET13}$ during the flyback period, wherein $V_{BET13}$ constitutes the conductivity threshold of transistor T13, transistor T13 begins to conduct, thereby causing the saturation of protective transistor T14. As long as such conditions apply, transistor T11 in the lower section of the final stage has its base practically shorted to its emitter, and therefore is able to withstand the maximum collector-to-emitter voltage permitted by its construction parameters ($BV_{CES}$). However, as soon as voltage $v_U$ begins to increase at the beginning of the fly-back signal, and throughout the time corresponding to the rising of that signal, a current is supplied to the base of driver transistor T7 through capacitors C1 and C2. Therefore, transistor T7 tends to leave its inactive state and supplies a base current to transistor T10, which, in turn, controls the base of transistor T11. Since this effect begins before the intervention of the protection due to the saturation of T14, transistor T11 is subjected, even though only for short periods of time, to powerful stresses with respect to both power and voltage.

Thanks to the circuit arrangement according to the present invention, the shortcoming described above does not occur, as will be clearly shown by the following explanation of its operation.

Let us consider first the operation of the amplifier in the absence of an input signal and then during the time corresponding to the front portion of input signal $V_R$.

In the absence of an input signal and with the differential input E at voltage Vref (a balanced condition), the current from constant current generator G1 is distributed equally between transistors T1 and T2. The collector currents of each of the two transistors generally differ from each other according to a ratio determined by the area of their respective emitter junctions. With respect to the first mirror, the collector current of transistor T4 is practically equal to that of transistor T3, because the emitter areas of the two transistors are identical, and the collector current of transistor T4 is also equal, if one neglects the base current of transistor T7, to the current of collector C21 of transistor T2. Similarly, the currents flowing through the two branches in the second mirror are substantially equal to each other, but the operating conditions of transistors T5 and T6 which compose it are different because their areas are different. To further explain, current I1 is defined as the current flowing through collectors C12 and C22 of the two transistors T1 and T2 and therefore through the two branches in the second power mirror, and voltage $V_{BE1}$ is defined as the voltage between the junction of the bases of transistors T5 and T6 and ground. As experts in the design of integrated circuits know, if the area of transistor T5 is 5 times greater than that of transistor T6, then the collector current of transistor T5 would be equal to a current $5I_1$, assuming that it was connected to a power generator capable of supplying a current of such a value. Since, however, the collector current of transistor T5 is set at a value equal to to the current I1, then transistor T5 necessarily is operating at a point in the saturation region of its characteristics, i.e.—at a collector-emitter voltage value $V_{CE} < V_{BE1}$. Since the base-emitter voltage required for transistor T12 to start conducting is practically equal to $V_{BE1}$, and since transistors T12 and T6 are fabricated in the same integrated circuit and are at the same temperature, transistor T12 is in its inactive state.

During the time corresponding to the front portion of input signal $V_R$, the conductivity of transistor T1 decreases while that of transistor T2 increases. This causes an increase in the base current of transistor T7 and, consequently, an increase in the conductivity of transistors T7, T10, and T11. The conductivity of transistor T6 also increases while that of transistor T5 decreases, so that the operating conditions of the second mirror are now such as to strengthen, if possible, the saturation state of transistor T5 and, therefore, the inactive state of transistor T12.

At the beginning of the flyback period $t_R$, i.e.—at the time corresponding to the descending front of input signal $v_R$, a negative voltage signal designated by $v_E$ in FIG. 2b, appears at the base of transistor T1 as a result of the temporary interruption of the regulating action of the feedback network, the negative voltage occurring at the same time instant that the current $i_L$ is inverted. As a result of that negative signal, the conductivity of transistor T1 increases, whereas that of transistor T2 decreases. This causes an operating mode opposite to that described above for the time corresponding to the front portion of $v_R$, whereby the base current of transistor T7 decreases. The decrease in base current of transistor T7, although its sign is such as to favor the inactivity of transistor T11, is nevertheless very slight, and therefore insufficient to mitigate to an appreciable extent the undesirable effect of capacitors C1 and C2 as described above.

With the circuit arrangement according to the present invention, on the other hand, as soon as the negative signal $v_E$ appears and the conductivity of transistor T2 decreases, the current which flows through the diode connected transistor T6 in the second mirror decreases, and therefore the voltage between its base and emitter terminals is also reduced until it reaches values much lower than $V_{BE1}$. Consequently, there is also a decrease in the current required by transistor T5 for the operation of the mirror according to the reflection ratio determined by the areas of the emitter junctions of transistors T5 and T6 and, since the current available to the collector of transistor T5 also increases as a result of the greater conductivity of transistor T1, transistor T5 now operates in the active area, i.e.—with a collector-emitter voltage greater than its base-emitter voltage. Since the collector-emitter voltage of transistor T5 is determined by its connection to the base of transistor T12 at the threshold voltage value $V_{BE1}$, the transistor T12 receives a base current equal to the difference between the current of collector C12 of transistor T1 and the current shunted by transistor T5. Therefore transistor T12 becomes saturated, thereby grounding, with a low impedance, capacitors C1 and C2. The duration of the negative peak, which is practically equal to the flyback period $t_R$, is much longer than the period during which the two capacitors are charged, and therefore makes possible their complete discharge. Since now no undersirable current flows through the base of transistor T7, the final transistor T11 remains inactive, with a very low base-emitter impedance, for the entire duration of the output overvoltage, thereby achieving the purpose of the invention, i.e.—reduced stresses on the final output stage.

It should be noted that the reflection ratio, or current gain, of the second mirror, defined by the ratio between the emitter junction areas of transistors T5 and T6, is determined, in the embodiment of the invention described above, taking into account that transistor T5 must be saturated during the duration of the ramp. In theory, i.e.—assuming a perfect balance between the two sections of the differential amplifier and the total absence of disturbing effects, it is sufficient for such a ratio to be just slightly greater than unity.

It should also be noted that the circuit arrangement according to the present invention starts operating whenever there is an inversion in the slope of the sawtooth input signal $v_R$, irrespective of the cause of such an inversion, and it therefore even protects the final stage of the amplifier against overvoltages due to accidental interruptions or discontinuities in the input signal.

Although only one embodiment of the invention has been illustrated and described, it is obvious that it may be the subject of many variants and modifications without falling outside the scope of said invention. For example, each of the two transistors with twin collectors in the differential amplifier might be replaced by a pair of transistors with only one collector having bases and emitters connected in parallel, or the second mirror might comprise two transistors having identical emitter junctions and other devices provided which are capable of determining the desired reflection ratio.

We claim:

1. A circuit arrangement for the protection of the final stage of a monolithic integrated circuit power amplifier used for providing the vertical deflection of a television picture tube, said amplifier comprising a number of amplifying stages including a differential input stage and a current amplifier final stage, said differential input stage having a first input connected to an output of a sawtooth signal source and a second input connected to a reference voltage source, said final stage being connected to a flyback signal generator and connected to a load comprising a picture tube deflection control circuit, an output of the final stage and said first input of said differential amplifier stage being connected to each other by a feedback network, said circuit arrangement comprising:

a circuit means for sensing any imbalance in currents flowing in said differential stage of opposite sign to an imbalance in said currents due to a front portion of a sawtooth signal output from sawtooth signal source, said circuit means capable of generating, as its output, a protective signal at the beginning of said imbalance of opposite sign, and a controlled electronic switch, which is normally open, and which is connected across input terminals of a predetermined stage among said number of amplifying stages in said amplifier;

wherein a control terminal of said switch is connected to the output of said circuit means so as to close during the appearance of said protective signal, thereby protecting said final stage of said amplifier.

2. A circuit arrangement as recited in claim 1, in which the differential input stage comprises a differential amplifier with bipolar transistors having a first section whose input is said first input of said differential amplifier stage and having a second section whose input is said second input of said differential amplifier stage, and having, as active load thereof, a first current mirror having its input branch connected to said first section and having its output branch connected to said second section of said differential amplifier stage;

wherein said predetermined stage among said number of amplifier stages in said amplifier comprises a voltage amplifier driver stage connected between said differential amplifier output and said final stage input, and said controlled electronic switch comprises a transistor connected with its emitter-collector portion in parallel to said driver stage input, and said circuit means comprises a second current mirror with bipolar transistors connected, through its input branch, to said second section and, through its output branch, to said first section of said differential amplifier, and wherein said second current mirror has a reflection ratio which is greater than unity.

3. A circuit arrangement as recited in claim 2, wherein said second current mirror comprises one transistor in its output branch and a diode connected transistor in its input branch, and wherein its reflection ratio is substantially equal to the ratio between emitter areas of said output branch transistor and said diode connected transistor.

4. A circuit arrangement as recited in claim 2, wherein said first and second sections in said differential amplifier comprises a first and a second transistor with twin collectors, respectively, the collectors of said first transistor being respectively connected to the input branch of said first current mirror and said output branch of said second current mirror, and the collectors of said second transistor being respectively connected to said output branch of said first current mirror and said input branch of said second current mirror.

* * * * *